United States Patent [19]
Homma

[11] Patent Number: 5,744,378
[45] Date of Patent: Apr. 28, 1998

[54] METHOD FOR FABRICATING A SEMICONDUCTOR DEVICE HAVING MULTILEVEL INTERCONNECTIONS

[75] Inventor: Tetsuya Homma, Tokyo, Japan

[73] Assignee: NEC Corporation, Tokyo, Japan

[21] Appl. No.: 755,198

[22] Filed: Nov. 25, 1996

Related U.S. Application Data

[63] Continuation of Ser. No. 355,625, Dec. 14, 1994, abandoned.

[30] Foreign Application Priority Data

Dec. 14, 1993 [JP] Japan ................................. 5-312417

[51] Int. Cl.$^6$ ................................................ H01L 21/28
[52] U.S. Cl. .......................... 437/195; 437/240; 437/241; 437/242
[58] Field of Search ............................... 437/195, 240, 437/241, 242; 148/DIG. 114

[56] References Cited

U.S. PATENT DOCUMENTS

| | | | |
|---|---|---|---|
| 4,830,974 | 5/1989 | Chang et al. | 437/195 |
| 5,010,024 | 4/1991 | Allen et al. | 437/195 |
| 5,139,971 | 8/1992 | Giridhar et al. | 437/195 |
| 5,215,787 | 6/1993 | Homma | 156/656 |
| 5,252,515 | 10/1993 | Tsai et al. | 437/195 |
| 5,288,518 | 2/1994 | Homma | 427/255.1 |
| 5,300,461 | 4/1994 | Ting | 437/241 |
| 5,319,479 | 6/1994 | Yamada et al. | 359/58 |
| 5,334,552 | 8/1994 | Homma | 437/195 |
| 5,364,818 | 11/1994 | Ouellet | 437/195 |
| 5,399,529 | 3/1995 | Homma | 437/195 |
| 5,399,533 | 3/1995 | Pramanik et al. | 437/231 |
| 5,420,075 | 5/1995 | Homma et al. | 437/195 |
| 5,429,995 | 7/1995 | Nishiyama et al. | 437/240 |
| 5,633,211 | 5/1997 | Imai et al. | 438/760 |

FOREIGN PATENT DOCUMENTS 38581 2/1991 Japan .

*Primary Examiner*—John Niebling
*Assistant Examiner*—Thomas G. Bilodeau

[57] ABSTRACT

At least one of an interlayer insulating film is formed by fluorine contained silicon oxynitride which is obtained by chemical deposition growth process using fluoroalkoxysilane gas, nitrogen gas contained gas, and oxygen gas contained gas. The at least one-film is formed at a temperature of lower than 200° C. As a result, reliability of a semiconductor device to be fabricated as described above is enhanced.

12 Claims, 9 Drawing Sheets

METHOD FOR FABRICATING A SEMICONDUCTOR DEVICE HAVING MULTILEVEL INTERCONNECTIONS

This is a continuation of application Ser. No. 08/355,625, filed Dec. 14, 1994, now abandoned.

FIELD OF THE INVENTION

The invention relates to a method for fabricating a semiconductor device, and more particularly to, a method for providing improved interlayer insulating film and surface protective film in a semiconductor device having multilevel interconnections.

BACKGROUND OF THE INVENTION

A conventional method for fabricating a semiconductor device comprises Al lower level wirings on a semiconductor device, providing first to third $SiO_2$ films insulating the lower level wirings on the semiconductor device, providing via-holes through the first to third $SiO_2$ films, providing upper level Al wirings on the third insulating film to be connected through the via-holes to the lower level wirings, and providing a surface protective film including a silicon nitride (SIN) film and a flattening polyimide film.

In the above described method, the first $SiO_2$ film is formed to have a thickness of 200 to 300 nm by plasma chemical vapor growth process on condition that a substrate heating temperature is 200° to 380° C., a chamber-inside pressure is 0.1 to 10 Torr, an electric power of 2 to 3 kW having a frequency of 13.56 MHz is used, and monosilane and nitrous oxide are used as source gases, and the atmospheric pressure CVD process on condition that a substrate heating temperature is 350° C. using tetraethoxylane (TEOS) and ozone ($O_3$). The third $SiO_2$ film is formed by plasma chemical vapor deposition process as used in forming the first $SiO_2$ film.

In the provision of the surface protective film, the silicon nitride (SiN) film is formed to have a thickness of 0.1 to 1.0 μm, and the polyimide film is formed to have a thickness of 0.3 to 2.0 μm by spin coat process.

In the conventional method for fabricating semiconductor devices, however, there are disadvantages as set out below.

(1) Cracks occur in the second $SiO_2$ film due to thermal stress, because the semiconductor substrate is heated at 350° C. Therefore, the film thickness is 1 μm at most. The occurrence of the cracks results in the deterioration of humidity proof property for the multilevel interconnections.

(2) Voids occur in the Al wirings due to the residual stress of more than 100 MPa. As a result, the Al wirings are broken to lower reliability, when a voltage is applied across the Al wirings.

(3) Residual moisture content is very high in the second $SiO_2$ film, moisture can be easily adsorbed to the films. As a result, the lower level Al wirings are oxidized on the surfaces thereof at the bottoms of the via-holes to increase a contact resistance, when the upper level Al wirings are formed on the third $SiO_2$ film.

(4) Residual stress is as large as 500 to 1000 MPa, when the silicon nitride film is used for the surface protective film. As a result, the Al wirings tend to be broken and to increase in resistance due to the migration by the residual stress, and, this results in the lowering of fabrication yield and reliability.

(5) Surface flatness of a fabricated semiconductor device is not obtained, unless the flattening polyimide film is used. When the surface flatness is not complete, stress is applied by a molding resin to lower reliability.

SUMMARY OF THE INVENTION

Accordingly, it is an object of the invention to provide a method for fabricating a semiconductor device in which multilevel interconnections having increased humidity proof are obtained.

It is a further object of the invention to provide a method for fabricating a semiconductor device in which Al wirings not being broken in operation are provided.

It is a still further object of the invention to provide a method for fabricating a semiconductor device in which lower level Al wirings are not oxidized on surfaces exposed by via-holes.

It is a yet still further object of the invention to provide a method for fabricating a semiconductor device in which a semiconductor device is fabricated with high yield and reliability.

According to the invention, a method for fabricating semiconductor devices, comprising the steps of:

an interlayer insulating film provided between lower and upper level wirings, and a surface protective film provided on the final level wirings, the method comprising the step of forming at least one of the interlayer insulating film and the surface protective film by fluorine contained silicon oxynitride, the fluorine contained silicon oxynitride being obtained by chemical vapor deposition process using fluoroalkoxysilane [$FnSi(OR)_{4-n}$, where R is alkyl radical, and n is one figure of 1, 2 and 3] gas, gas containing nitrogen atoms, and gas containing oxygen gas.

BRIEF DESCRIPTION OF THE DRAWINGS

The invention will be explained in more detail in conjunction with appended drawings, wherein.

DESCRIPTION OF THE PREFERRED EMBODIMENTS

Before explaining a method for fabricating a semiconductor device in the preferred embodiment, the aforementioned conventional method for fabricating a semiconductor device will be explained.

Figure 1A:
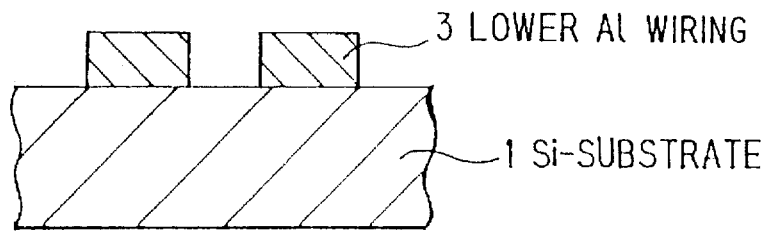
FIGS. 1A to 1F are cross-sectional views showing the steps in a conventional method for fabricating a semiconductor device.

In FIG. 1A, lower level Al wirings 3 are formed on a semiconductor substrate 1.

Figure 1B:
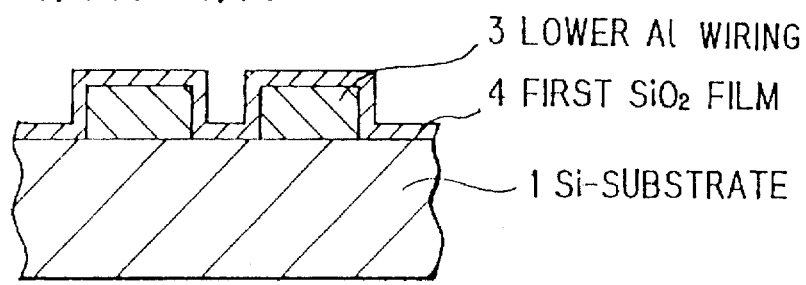

In FIG. 1B, a first $SiO_2$ film 4 having a thickness of 200 to 300 nm is formed on the lower level Al wirings 3 and the semiconductor substrate 1 by plasma chemical vapor deposition process, in which a temperature of heating the semiconductor substrate 1 is 200° to 380° C., a pressure is 0.1 to 10 Torr in a growth chamber, an electric power of 2 to 3 kW having a frequency of 13.56 MHz is used, and monosilane and nitrous oxide are used as source gases.

Figure 1C:
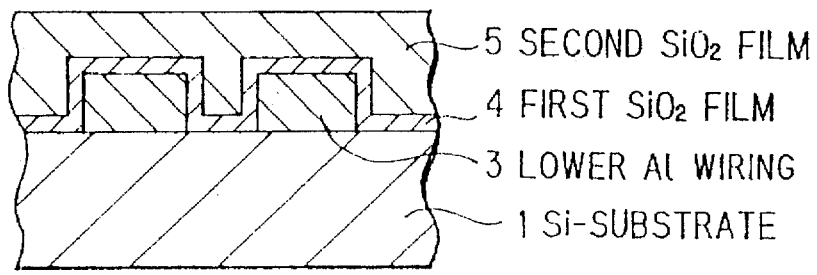

In FIG. 1C, tetraethoxylane (TEOS) and ozone ($O_3$) are used to form a second $SiO_2$ film 5 having a thickness of approximately 2.0 μm on the first $SiO_2$ film 4 at a substrate temperature of 350° C. by atmospheric pressure CVD process.

Figure 1D:
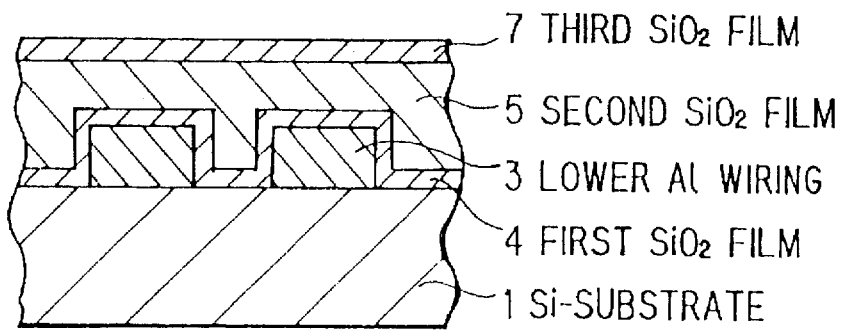

In FIG. 1D, a third $SiO_2$ film 7 is formed on the second $SiO_2$ film 5 by plasma chemical vapor deposition process.

Figure 1E:
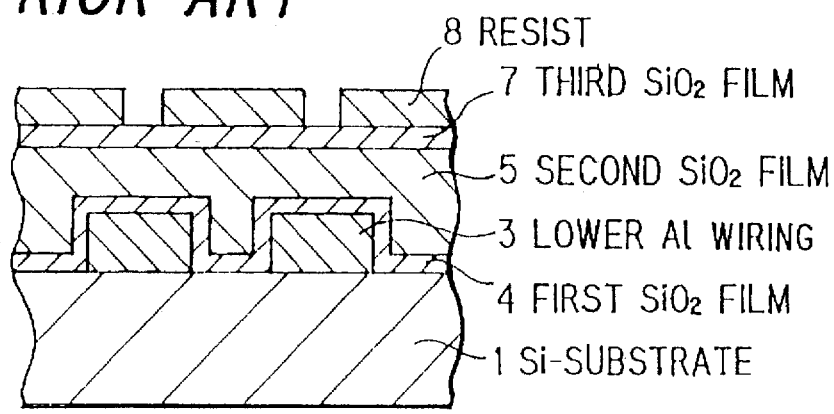

In FIG. 1E, a photoresist film 8, which is a mask for forming via-holes, is formed on the third $SiO_2$ film 7 by photolithography, and the via-holes are formed through the first to third $SiO_2$ films 4, 5 and 7 by using the photoresist film 8 as an etching mask.

Figure 1F:
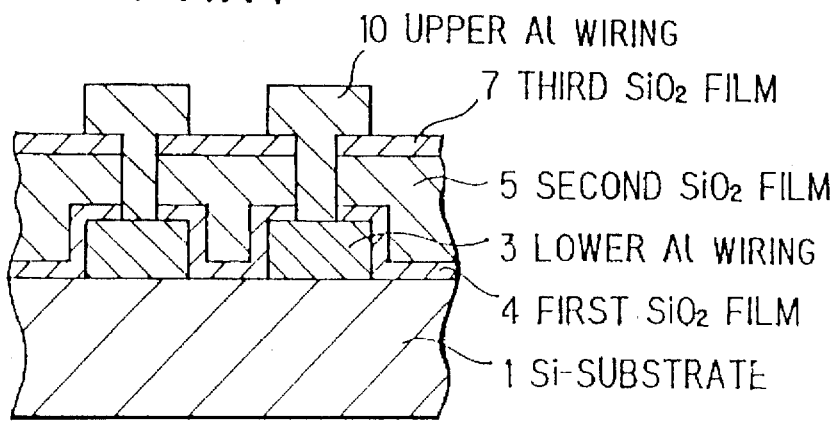

In FIG. 1F, upper level Al wirings 10 are formed to be connected through the via-holes to the lower level wirings 3. Thus, a doubl-level Al interconnection structure is obtained.

The above explained method for fabricating a semiconductor device is described in the Japanese Patent Kokai No. 2-209753.

Then, a surface protective film comprising a silicon nitride (SIN) film and a flattening polyimide film is formed thereon as described in the Japanese Patent Kokoku No. 3-8581, wherein the SiN film is grown to have a thickness of 0.1 to 1.0 μm by plasma chemical vapor deposition process, and the polyimide film is formed to have a thickness of 0.3 to 2.0 μm by spin-coat process.

In a semiconductor device thus fabricated, the first to third $SiO_2$ films 4, 5 and 7 provide an interlayer insulating film.

Next, a method for fabricating a semiconductor device in the preferred embodiments according to the invention will be explained.

Figure 2A:
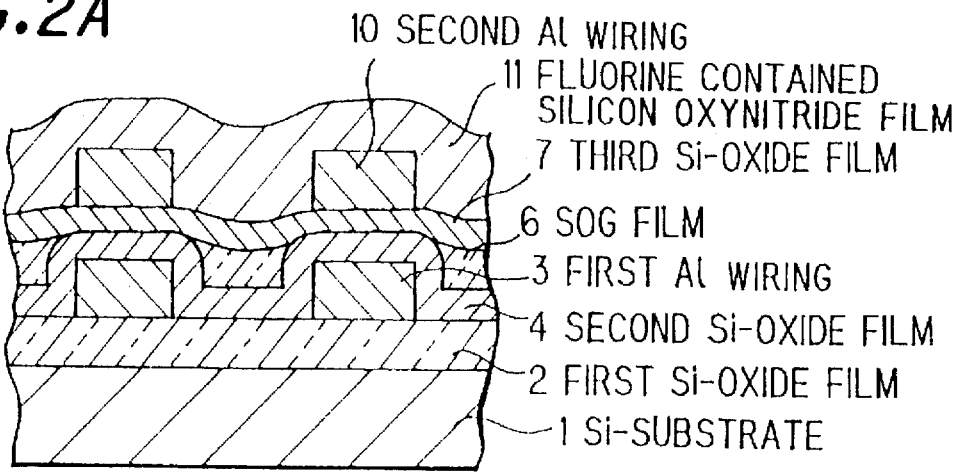
FIGS. 2A to 2C are cross-sectional views showing three types of semiconductor devices fabricated in a method for fabricating a semiconductor device in preferred embodiments according to the invention.
Figure 2B:
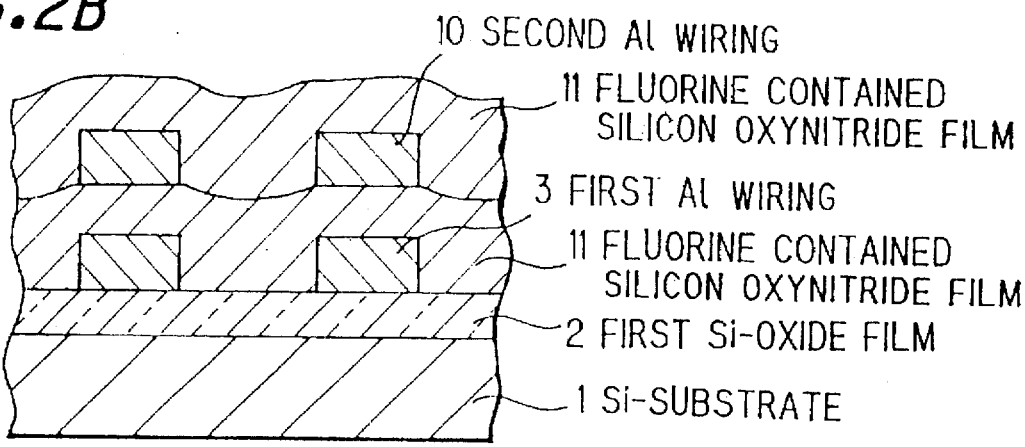
Figure 2C:
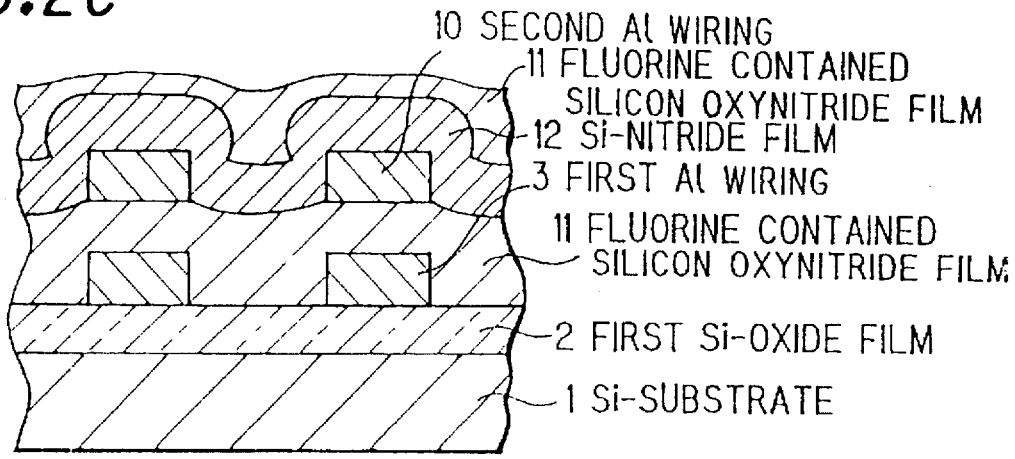

FIGS. 2A to 2C show semiconductor devices fabricated in the preferred embodiments.

In FIG. 2A, the semiconductor device comprises a silicon substrate 1, a first silicon oxide (BPSG) film 2, first Al wirings 3, a second silicon oxide film 4, a spin on glass (SOG) film 6, a third silicon oxide film 7, second Al wirings 10, and a surface protective film 11 of fluorine contained silicon oxynitride, wherein the SOG film 6 and the third silicon oxide film 7 are for an interlayer insulating film.

In FIG. 2B, the semiconductor device comprises a silicon substrate 1, a first silicon oxide (BPSG) film 2, first Al wirings 3, a fluorine contained silicon oxynitride film 11 for J an interlayer insulating film, second Al wirings 10, and a surface protective film 11 of fluorine contained silicon oxynitride.

In FIG. 2C, the semiconductor device comprises a silicon substrate 1, a first silicon oxide (BPSG) film 2, first Al wirings 3, a fluorine contained silicon oxynitride film 11 for an interlayer insulating film, second Al wirings 10, silicon nitride film 12, and fluorine contained silicon oxynitride film 11, wherein the silicon nitride film 12 and the fluorine contained silicon oxynitride film 11 are for a surface protective film.

A method for fabricating a semiconductor device in the first preferred embodiment will explained to fabricate the semiconductor device as shown in FIG. 2A.

Figure 3A:
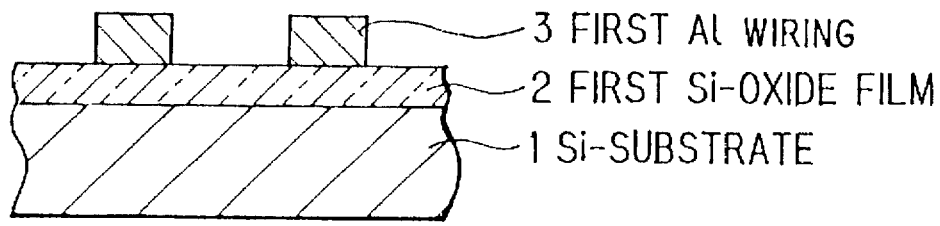
FIGS. 3A to 3G are cross-sectional views showing the steps in a method for fabricating a semiconductor device in a first preferred embodiment according to the invention.

In FIG. 3A, the first Al wirings 3 having a thickness of approximately 0.8 μm are formed on the first silicon oxide film 2 of boron phosphorus silicide glass (BPSG) having a thickness of approximately 0.8 μm formed on the silicon substrate 1.

Figure 3B:
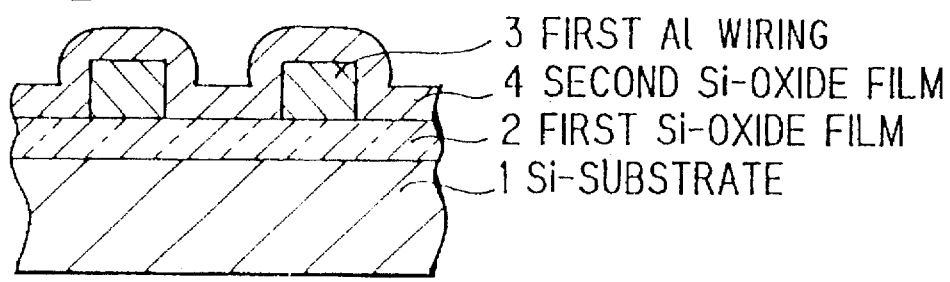

In FIG. 3B, the second silicon oxide film 4 having a thickness of approximately 0.4 μm is formed on the first Al wirings 3 on the BPSG film 2 by plasma chemical vapor phase deposition process on condition that tetraethoxysilane [$Si(OC_2H_5)_4$ defined as TEOS hereinafter] gas and oxygen gas are used with gas flow rates of 50 sccm and 100 sccm, respectively, a pressure is 10 Torr, an electric power is 500 W with high frequency of 13.56 MHz, and a temperature of the semiconductor substrate 1 is 300° C.

Figure 3C:
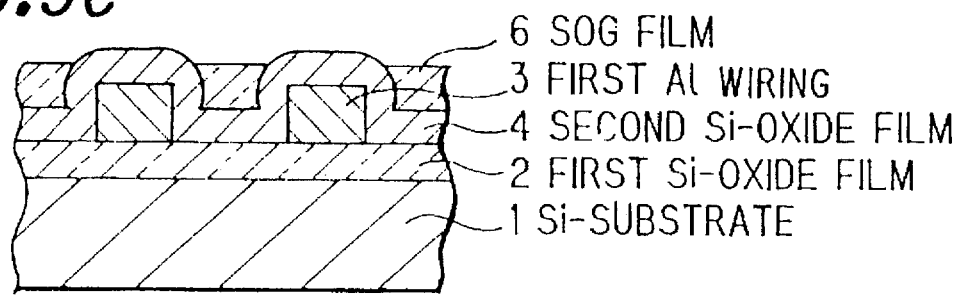

In FIG. 3C, the SOG glass 6 is formed and etched back, so that concave portions are buried with the SOG film 6.

Figure 3D:
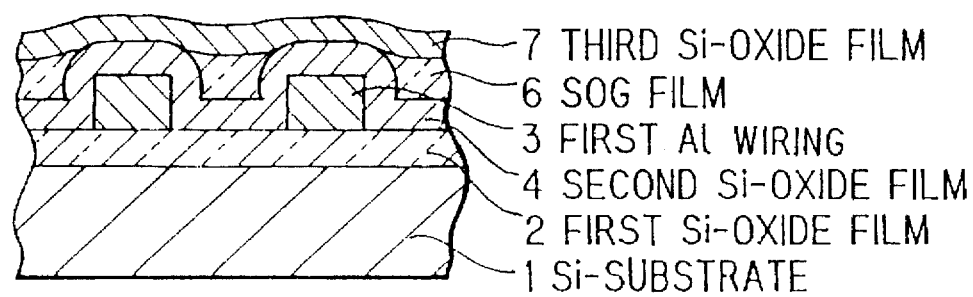

In FIG. 3D, the third silicon film 7 having a thickness of approximately 0.4 μm is formed on the same condition as that for the second silicon oxide film 4.

Figure 3E:
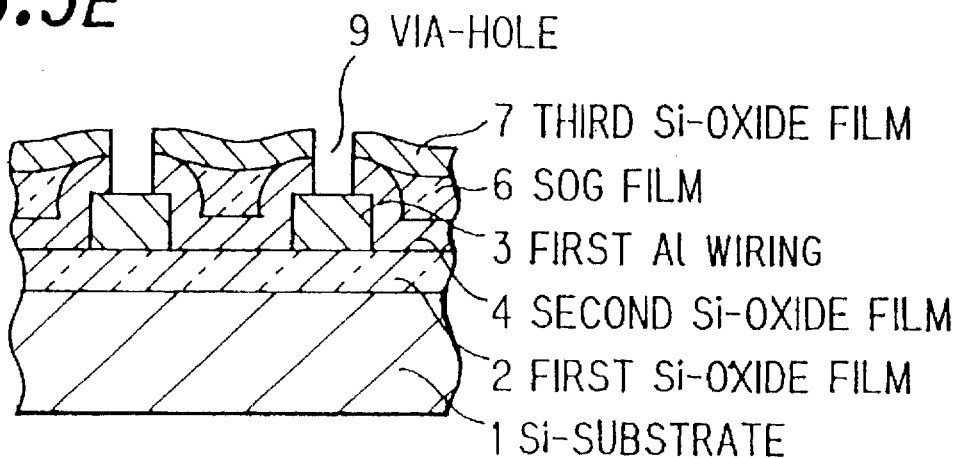

In FIG. 3E, via-holes 9 are formed through the second and third silicon oxide films 4 and 7.

Figure 3F:
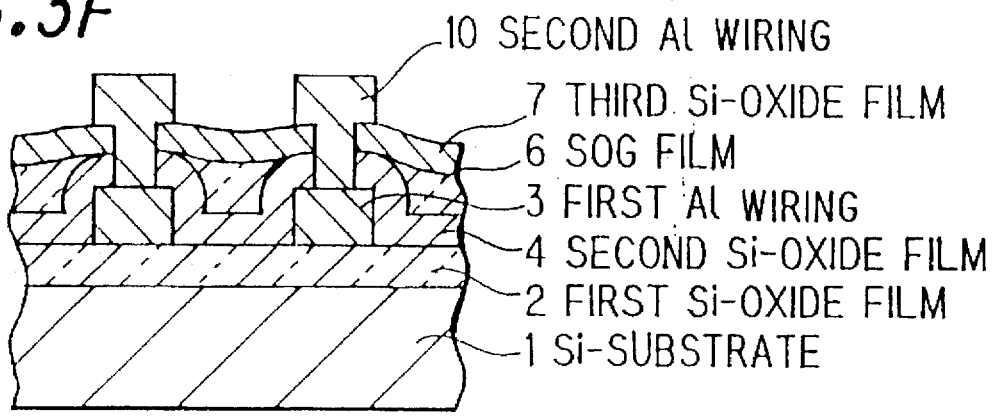

In FIG. 3F, the second Al wirings 10 having a thickness of approximately 0.8 μm are formed to be connected through the via-holes 9 to the first Al wirings 3.

Figure 3G:
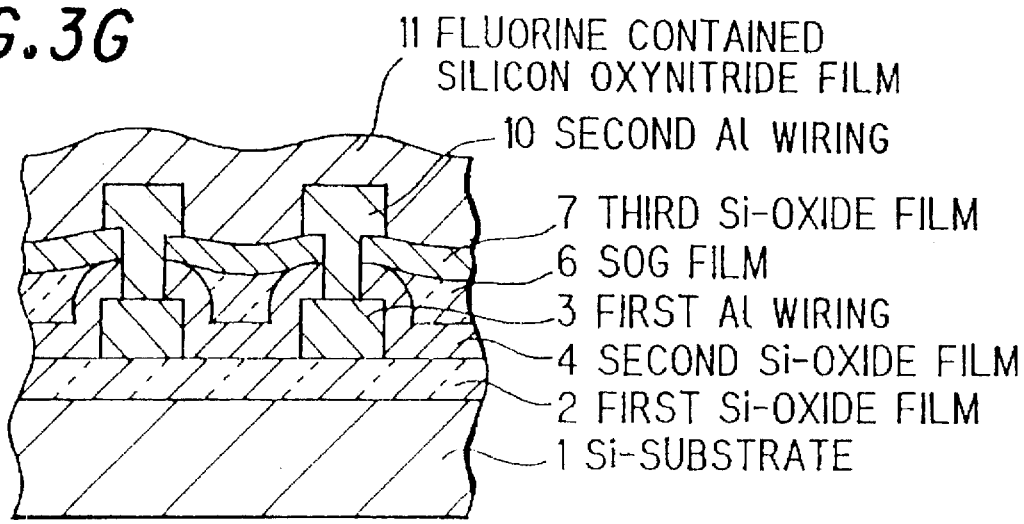

In FIG. 3G, the fluorine contained silicon oxynitride film 11 having a thickness of approximately 1.5 μm for the surface protective film is finally formed on condition as set out below.

Fluorotrinormalpropokysilane [$FnSi(OC_3H_7)_3$], ammonia ($NH_3$) gas, and ozone ($O_3$) are used as source gas materials. Gas of $FnSi(OC_3H_7)_3$ is obtained in nitrogen bubbling by using a bubbler which is maintained at a temperature of 60° C. The gas of $FnSi(OC_3H_7)_3$ containing bubbling nitrogen gas, the ammonia gas, and the ozone gas containing oxygen gas and having a $O_3$ concentration of approximately 5% are supplied with flow rates of 1 SLM, 0.2 SLM and 5 SLM, respectively, to a reaction chamber in which a pressure is 600 Torr, and a temperature of the semiconductor substrate 1 is 100° C. Composition of a fluorine contained silicon oxynitride film obtained on the above described condition is observed by a X-ray photospectrometer (XPS). The result shows that the composition is $SiO_{1.7}N_{0.2}F_{0.1}$. In evaluating the characteristics of the film, a fluorine contained silicon oxynitride film having a thickness of approximately 0.4 μm is formed on a silicon substrate having a diameter of 6 in. The result is that a refractive index of the film is approximately 1.60, and a residual stress is approximately 50 MPa which is lower than that of the conventional silicon nitride film which represents 500 to 1000 MPa by more than one order, and is also lower than that of a silicon oxide film formed by using TEOS and ozone, that is, 200 MPa. Consequently, the occurrence of voids in the Al wirings caused by stress applied thereto is completely avoided. On the other hand, leakage current and dielectric constant of the film are checked by using a MIS diode having an Al/SiONF/Si structure in which an area of Al electrodes is 4 $mm^2$. The result is that a leakage current density is as small as approximately $5×10^{-11} A/cm^2$, when a voltage of 5V is applied thereto, and a specific conductivity is approximately 4.5 at a frequency of 1 MFz. The result also shows that a residual moisture content is reduced to be one-fifth as compared to that of the conventional silicon oxide film. In addition, step differences and concave portions on the Al wirings 10 (thickness of 0.8 μm, width of 0.6 μm and interval of 0.6 μm) are easily and smoothly covered and buried and appropriately flattened by the fluorine contained silicon oxynitride film 11 having a thickness of approximately 1.5 μm, so that no void and crack occurs therein.

The fluorine contained silicon oxynitride film used in the invention has highly improved film characteristics even at a substrate temperature of 100° C. This is because fluorine functions as catalyst in the film growing reaction, so that a film growing temperature of at most 200° C. is enough in the invention to lower a formation temperature, thereby reducing residual stress discussed before as the disadvantages in the conventional method for fabricating a semiconductor device. Further, the fluorine contained silicon oxynitride film lowers a dielectric constant because of fluorine contained therein as compared to specific conductivities of approximately 7 for the conventional silicon nitride film and 5 to 6 for an silicon oxynitride film. An intermediate substance of fluorine contained silicon oxynitride which is adsorbed on the surface of a substrate has a high fluidity, and the film formation is carried out at a low temperature and under a comparatively high pressure, so that flatness is improved.

The pressure cooker test is conducted on the semiconductor device fabricated in the first preferred embodiment on condition that a test time is 300 hrs., a temperature is 125° C., and a pressure is 2 atm. In this test, no corrosion of the Al wirings is found. This is because water-repellency is increased by fluorine contained in the film, and invasion of moisture is interrupted by a silicon nitride component.

As described before, the fluorine contained silicon oxynitride film can be formed at a low temperature with a small residual stress. Consequently, a thick film thereof can be obtained to increase humidity proof property, wherein no crack occurs even if it is as thick as 3 µm.

A connection resistance through the via-hole 9 (diameter of 0.8 µm) between the first and second Al wirings is approximately 0.15Ω which is lower than a connection resistance of 0.2Ω in a semiconductor device fabricated in the conventional method.

When a composition of the fluorine contained silicon oxynitride film is represented by $SiO_{2-x}N_{x(1-y)}F_{xy}$, the above described advantages are obtained in the ranges of $0.1 \leq x \leq 0.5$; and $0.1 \leq y \leq 0.5$.

A method for fabricating a semiconductor device in the second preferred embodiment will be explained to fabricate the semiconductor device as shown in FIG. 2B.

Figure 4A:
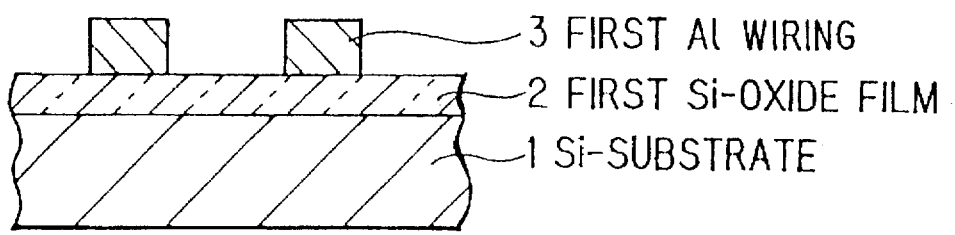
FIGS. 4A to 4E are cross-sectional views showing the steps in a method for fabricating a semiconductor device in a second preferred embodiment according to the invention.

In FIG. 4A, the first Al wirings 3 having a thickness of approximately 0.8 µm are formed on the BPSG film 2 having a thickness of approximately 0.8 µm provided on the silicon substrate 1.

Figure 4B:
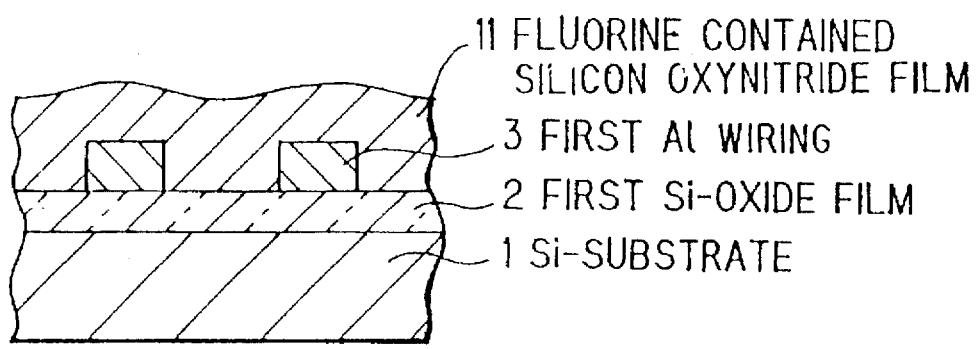

In FIG. 4B, the fluorine contained silicon oxynitride film 11 having a thickness of approximately 1.3 µm, is formed on the first Al wirings 3 on the BPSG film 2 on the same condition as that in the first preferred embodiment.

Figure 4C:
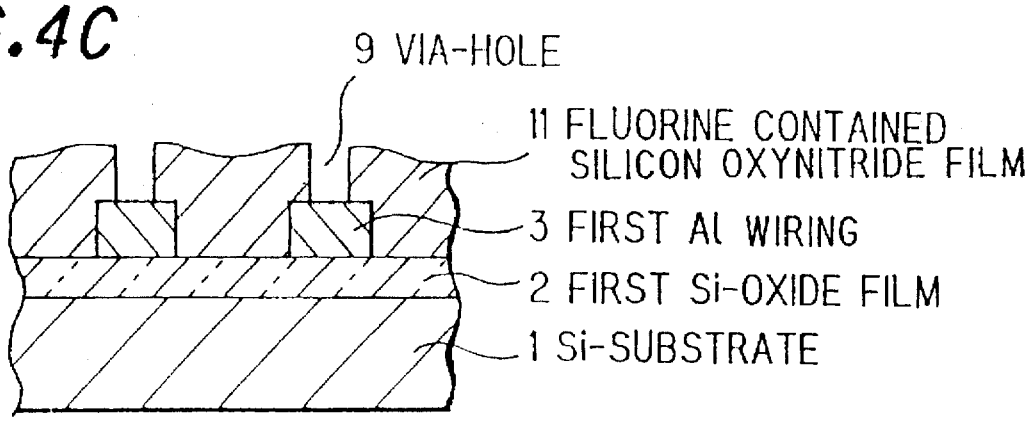

In FIG. 4C, the via-holes 9 are formed through the fluorine contained silicon oxynitride film 11 to expose the first Al wirings 11.

Figure 4D:
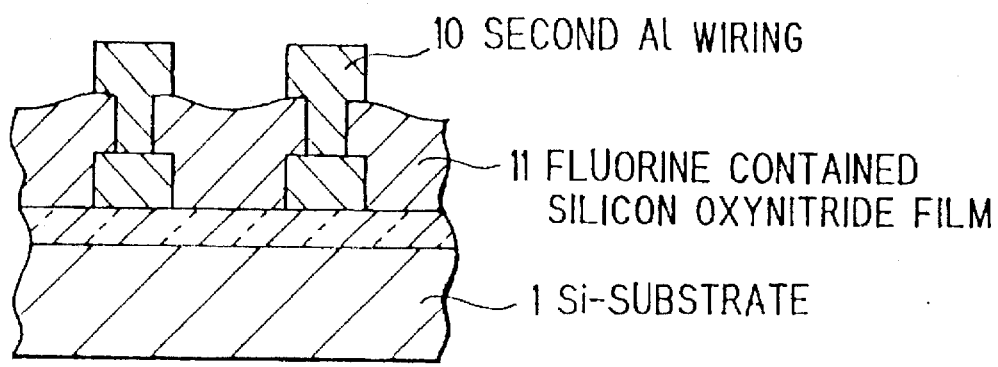

In FIG. 4D, the second Al wirings 10 having a thickness of approximately 0.8 µm are formed to be connected to the first Al wirings 3.

Figure 4E:
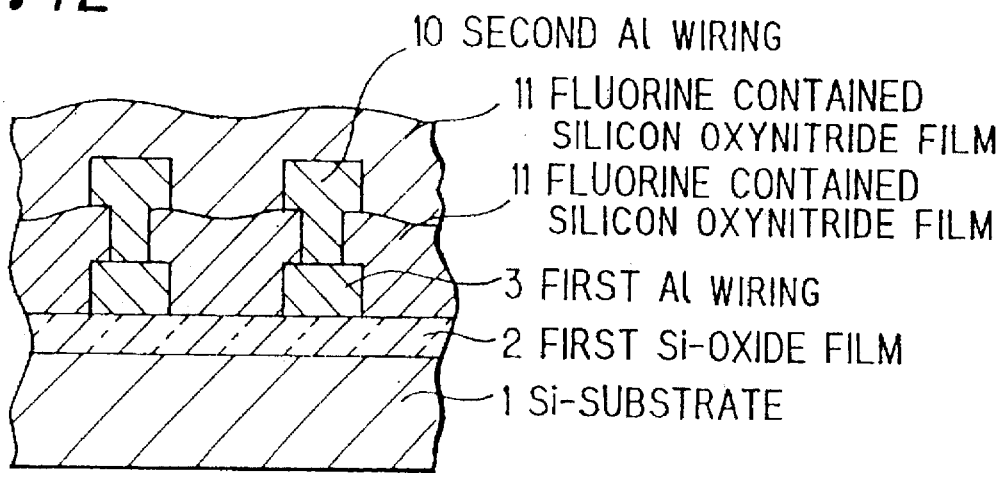

In FIG. 4E, the fluorine contained silicon oxynitride film 11 having a thickness of approximately 1.5 µm for the surface protective film is formed.

In the semiconductor device thus fabricated, the pressure cooker test of 300 hrs. is conducted at a temperature of 125° C. and a pressure of 2 atm. The result is that no corrosion occurs in the Al wirings, and no Al wiring is broken or short-circuited. In short, the same advantages as in the first preferred embodiment are obtained in the second preferred embodiment.

A method for fabricating a semiconductor device in the third preferred embodiment will be explained to fabricate the semiconductor device as shown in FIG. 2C.

Figure 5A:
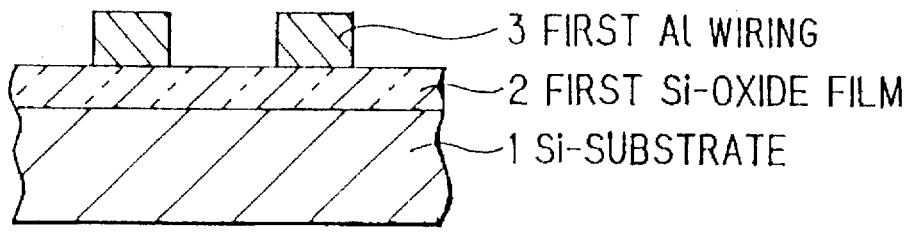
FIGS. 5A to 5E are cross-sectional views showing the steps in a method for fabricating a semiconductor device in a third preferred embodiment according to the invention.

In FIG. 5A, the first Al wirings 3 having a thickness of approximately 0.8 µm are formed on the BPSG film 2 having a thickness of approximately 0.8 µm provided on the silicon substrate 1.

Figure 5B:
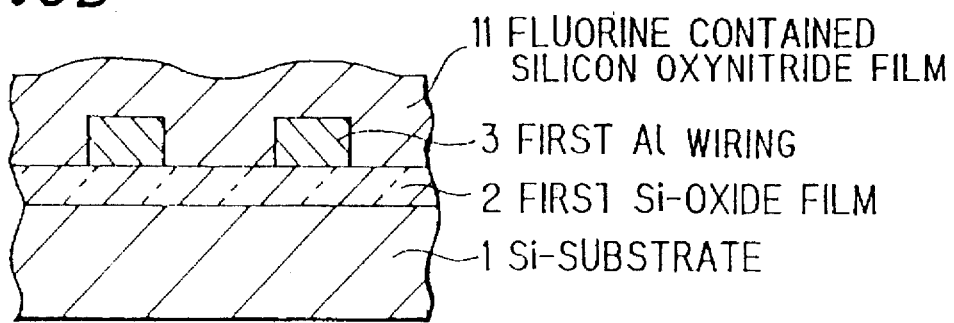

In FIG. 5B, the fluorine contained silicon oxynitride film 11 for the interlayer insulating film having a thickness of approximately 1.3 µm, is formed on the same condition as that in the first preferred embodiment.

Figure 5C:
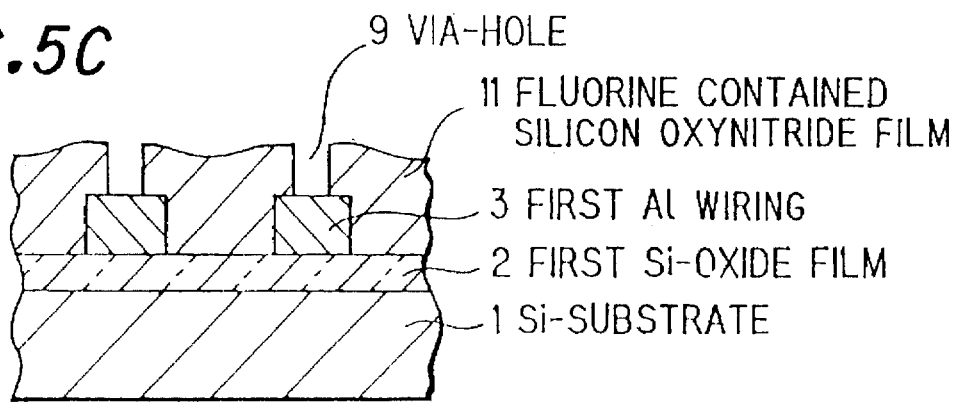

In FIG. 5C, the via-holes 9 are formed through the fluorine contained silicon oxynitride film 11 to expose the first Al wirings 3.

Figure 5D:
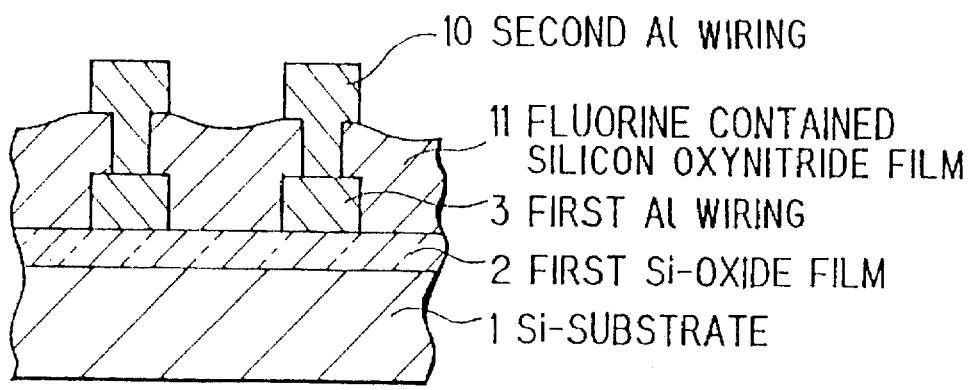

In FIG. 5D, the second Al wirings 10 having a thickness of approximately 0.8 µm is formed to be connected to the first Al wirings 3.

Figure 5E:
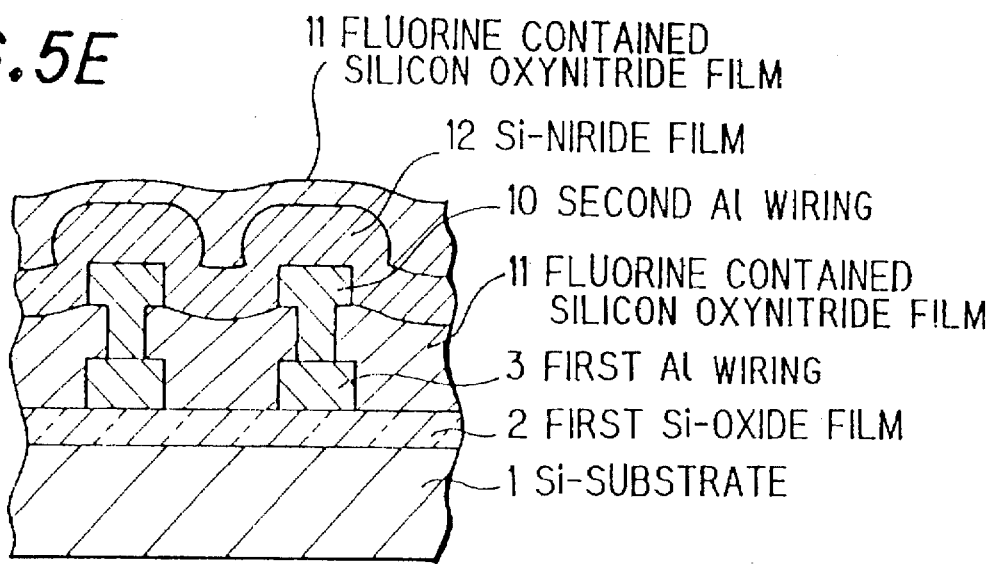

In FIG. 5E, the silicon nitride film 12 having a thickness of approximately 0.7 µm is formed to cover the second Al wirings 10, wherein the silicon nitride film 12 is obtained by plasma chemical vapor deposition process using silane ($SiH_4$) gas and ammonia ($NH_3$) gas at a substrate temperature of 290° C., and the fluorine contained silicon oxynitride film 11 having a thickness of approximately 0.5 µm is formed on the same condition as that in the first preferred embodiment.

In the semiconductor device thus fabricated, the pressure cooker test of 300 hrs. is conducted in the same manner as in the first and second preferred embodiments. The result is that the same advantages are obtained as those in the semiconductor devices fabricated in the first and second preferred embodiments. Especially, the fluorine contained silicon oxynitride film 11 is formed on the silicon nitride film 12, so that the surface protective film has highly improved flatness to increase reliability without using a polyimide film.

In the first to third preferred embodiments, Al for the wirings may be replaced by one of Al-alloy, W, Mo, Cu., Pt, Au, Ti, polysilicon, and metal silicide, or a layered structure comprising one of the above described metals and metal silicide and films of one selected from Ti-contained tungsten, Ti-nitride, Ta, and Ti provided on both sides thereof. Of course, the Al wirings may be more than three-level.

The fluorine contained silicon oxynitride film may be layered on one of other silicon oxide and nitride films, and may be obtained by using fluorotrimethoxysilane, fluorotriethoxysiliane, fluorotriisopropoxysilane, fluorotributhoxysilane, etc. in place of fluorotrinormalpropoxysilane to be reacted with ozone and ammonia gases.

Ozone gas may be replaced by oxygen gas or steam, and thermal-chemical vapor deposition process, photo-chemical vapor deposition process, or chemical vapor deposition process using electron cyclotron resonance may replace plasma chemical vapor phase growth process for the production of the fluorine contained silicon oxynitride film.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method for fabricating a semiconductor device, comprising the steps of:

forming a first wiring on an insulating film surface of a semiconductor substrate;

forming an insulating layer on said first wiring;

forming a spin-on-glass film on said insulating layer;

partly etching said spin-on-glass film so as to remove said spin-on-glass film formed on said insulating layer in a region above said first wiring;

forming a further insulating layer on said spin-on-glass film;

forming a via-hole through said further insulating layer and said insulating layer to expose said first wiring;

connecting a second wiring to said first wiring through said via-hole; and forming on said second wiring and on said further insulating film, an insulating layer of fluorine contained silicon oxynitride by chemical vapor deposition process using fluoroalkoxysilane gas containing nitrogen atoms, and gas containing oxygen atoms, while substrate temperature does not exceed 200° C.

2. The method as defined in claim 1, wherein:

said gas containing nitrogen atoms is one of $N_2$ gas, $N_2O$ gas or $NH_3$ gas.

3. The method as defined in claim 1 wherein:

said gas containing oxygen atoms is one of $O_2$ gas, steam, or $O_3$ gas.

4. The method as defined in claim 1, wherein:

said chemical vapor deposition process is one of thermal-chemical vapor deposition process, plasma chemical vapor deposition process, photo-chemical vapor deposits on process, or chemical vapor deposition process using electron cyclotron resonance.

5. A method for fabricating a semiconductor device, comprising the steps of:

forming a first wiring on an insulating film surface of a semiconductor substrate;

forming an insulating layer of fluorine contained silicon oxynitride on said insulating film surface of said semiconductor substrate to insulate said first wiring;

forming a via-hole through said insulating layer to expose said first wiring;

connecting a second wiring to said first wiring through said via-hole; and forming on said insulating layer a surface protective film of fluorine contained silicon oxynitride by chemical vapor deposition process using fluoroalkoxysilane gas containing nitrogen atoms, and gas containing oxygen atoms, to cover said wiring while substrate temperature does not exceed 200° C.

6. The method as defined in claim 5, wherein:

said gas containing nitrogen atoms is one of $N_2$ gas, $N_2O$ gas or $NH_3$ gas.

7. The method as defined in claim 5, wherein:

said gas containing oxygen atoms is one of $O_2$ gas, steam, or $O_3$ gas.

8. The method as defined in claim 5, wherein:

said chemical vapor deposition process is one of thermal-chemical vapor deposition process, plasma chemical vapor deposition process, photo-chemical vapor deposition process, or chemical vapor deposition process using electron cyclotron resonance.

9. A method for fabricating a semiconductor device, comprising the steps of:

forming a lower level wiring on an insulating film surface of a semiconductor substrate;

forming an interlayer insulating film of a fluorine contained silicon oxynitride on said insulating film surface of said semiconductor substrate to insulate said lower level wiring;

forming a via-hole through said interlayer insulating film to expose said lower level wiring;

forming an upper level wiring on said interlayer insulating film so as to connect said upper layer wiring to said lower level wiring through said via-hole;

forming a silicon nitride film on said interlayer insulating film so as to cover said upper level wiring, said silicon nitride film being a part of a surface protective film; and forming on said silicon nitride film a film of fluorine contained silicon oxynitride to form a remaining part of said surface protective film by chemical vapor deposition process using fluoroalkoxysilane gas containing nitrogen atoms, and gas containing oxygen atom, while substrate temperature does dot exceed 200° C.

10. The method as defined in claim 9, wherein:

said gas containing nitrogen atoms is one of $N_2$ gas, $N_2O$ gas or $NH_3$ gas.

11. The method as defined in claim 9, wherein:

said gas containing oxygen atoms is one of $O_2$ gas, steam, or $O_3$ gas.

12. The method as defined in claim 9, wherein:

said chemical vapor deposition process is one of thermal-chemical vapor deposition process, plasma chemical vapor deposition process, photo-chemical vapor deposition process, or chemical vapor deposition process using electron cyclotron resonance.

* * * * *